(12) United States Patent
Suzuki

(10) Patent No.: US 10,886,337 B2
(45) Date of Patent: Jan. 5, 2021

(54) DISPLAY DEVICE AND ELECTRONIC APPARATUS

(71) Applicant: SONY CORPORATION, Tokyo (JP)

(72) Inventor: Masaki Suzuki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 210 days.

(21) Appl. No.: 15/502,819

(22) PCT Filed: Jul. 10, 2015

(86) PCT No.: PCT/JP2015/069853
§ 371 (c)(1),
(2) Date: Feb. 9, 2017

(87) PCT Pub. No.: WO2016/027586
PCT Pub. Date: Feb. 25, 2016

(65) Prior Publication Data
US 2017/0229519 A1 Aug. 10, 2017

(30) Foreign Application Priority Data

Aug. 20, 2014 (JP) ................................. 2014-167195

(51) Int. Cl.
| | |
|---|---|
| H01L 27/32 | (2006.01) |
| H01L 51/52 | (2006.01) |
| G02B 27/01 | (2006.01) |
| G02B 5/20 | (2006.01) |

(Continued)

(52) U.S. Cl.
CPC .............. *H01L 27/32* (2013.01); *G02B 5/20* (2013.01); *G02B 5/201* (2013.01); *G02B 27/017* (2013.01); *G02B 27/0172* (2013.01); *H01L 27/322* (2013.01); *H01L 51/50* (2013.01); *H05B 33/24* (2013.01); *G02B 2027/0112* (2013.01); *H01L 51/5271* (2013.01)

(58) Field of Classification Search
CPC ................................. H01L 27/32; H01L 51/50
See application file for complete search history.

(56) References Cited

U.S. PATENT DOCUMENTS

2006/0261729 A1* 11/2006 Ito .................... H01L 27/3246
313/503
2012/0050600 A1* 3/2012 Ahn .................. H01L 27/14629
348/336

(Continued)

FOREIGN PATENT DOCUMENTS

| JP | 2011-022432 A | 2/2011 |
| JP | 2011-128437 A | 6/2011 |

(Continued)

*Primary Examiner* — Kenneth Parker
*Assistant Examiner* — Long H Le
(74) *Attorney, Agent, or Firm* — Chip Law Group

(57) ABSTRACT

A display device of the disclosure includes a first substrate that includes light emitting elements and color elements for respective pixels, in which the color elements are provided over the light emitting elements. The color elements include: a color element of one color including a first edge face; a color element of another color including a second edge face, in which the second edge face is adjacent to the first edge face, and at least the first edge face and the second edge face each have inclination; and a reflector structure provided in a gap formed by the inclination.

13 Claims, 10 Drawing Sheets

(51) Int. Cl.
    *H05B 33/24*     (2006.01)
    *H01L 51/50*     (2006.01)

(56) References Cited

U.S. PATENT DOCUMENTS

| | | | | |
|---|---|---|---|---|
| 2012/0170253 | A1* | 7/2012 | Park | G02F 1/133605 |
| | | | | 362/97.1 |
| 2012/0267744 | A1* | 10/2012 | Tsuji | H01L 27/14621 |
| | | | | 257/432 |
| 2013/0105782 | A1* | 5/2013 | Matsushima | H01L 51/0005 |
| | | | | 257/40 |
| 2014/0117842 | A1* | 5/2014 | Hanamura | H01L 27/3248 |
| | | | | 313/504 |
| 2014/0321101 | A1* | 10/2014 | Kadowaki | G02F 1/133617 |
| | | | | 362/84 |
| 2015/0311250 | A1* | 10/2015 | Seo | H01L 51/5012 |
| | | | | 257/89 |
| 2015/0349030 | A1* | 12/2015 | Ono | H01L 51/5284 |
| | | | | 257/40 |
| 2016/0035795 | A1* | 2/2016 | Lim | H01L 27/322 |
| | | | | 257/40 |

FOREIGN PATENT DOCUMENTS

| | | |
|---|---|---|
| JP | 2012-038677 A | 2/2012 |
| JP | 2013-206613 A | 10/2013 |
| JP | 2013-258021 A | 12/2013 |

* cited by examiner

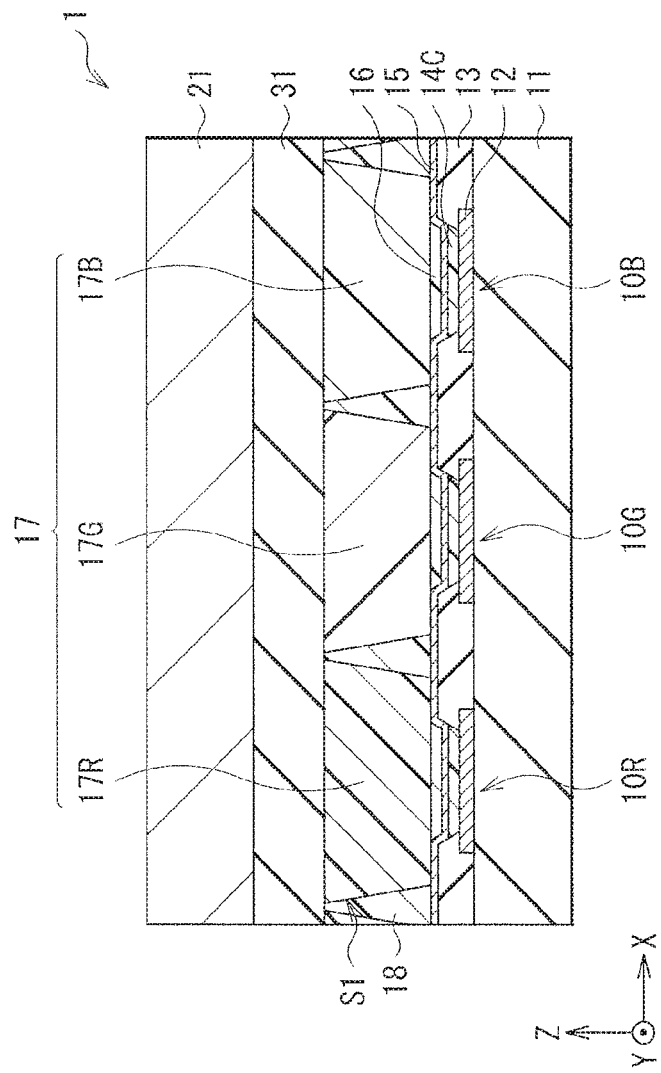
[FIG. 1]

[ FIG. 2 ]
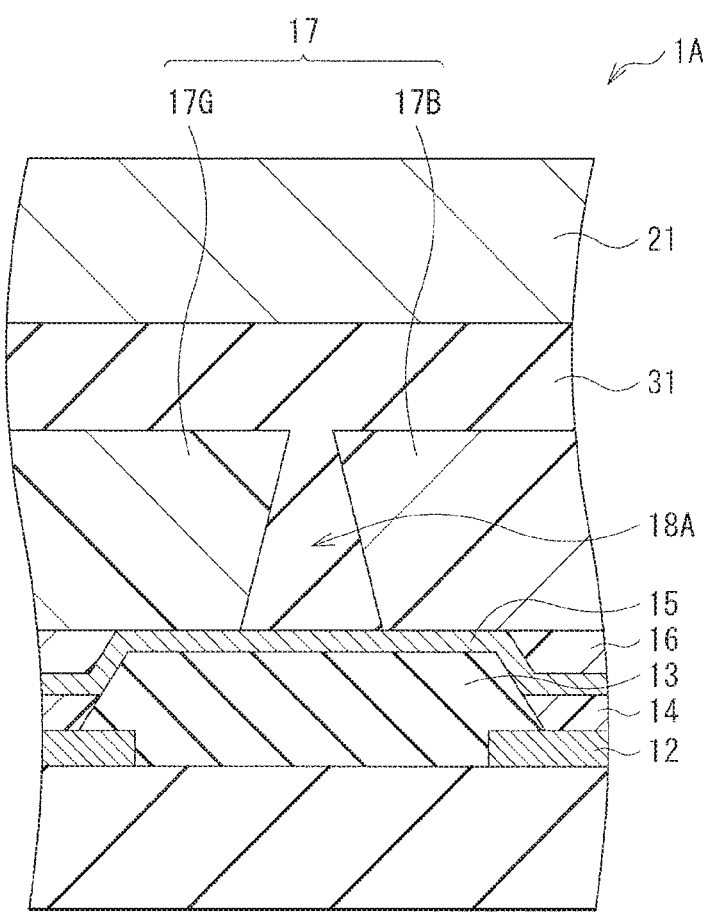

[FIG. 3]
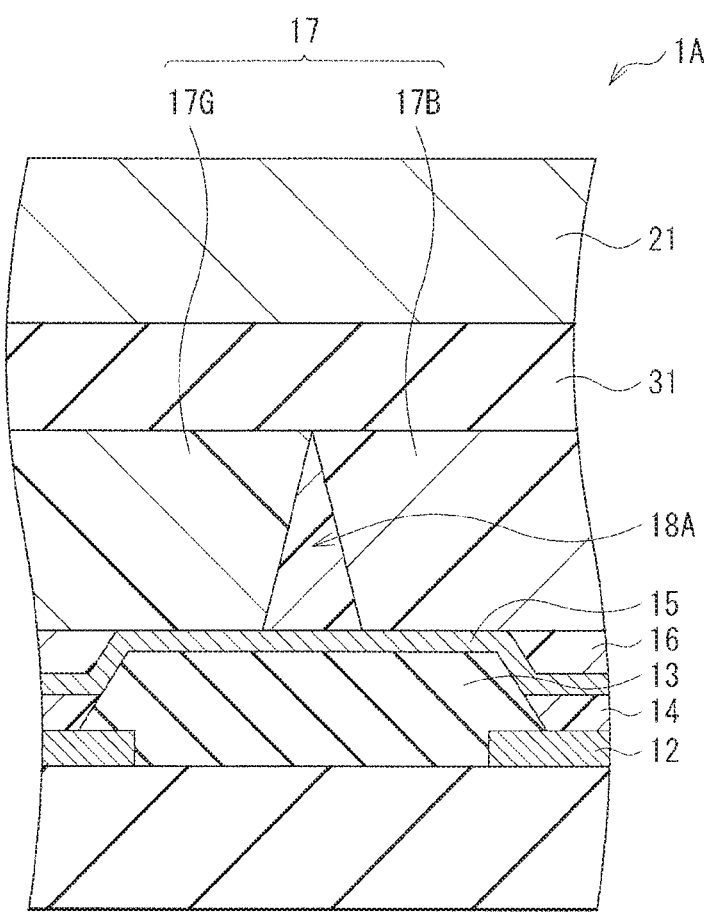

[ FIG. 4 ]
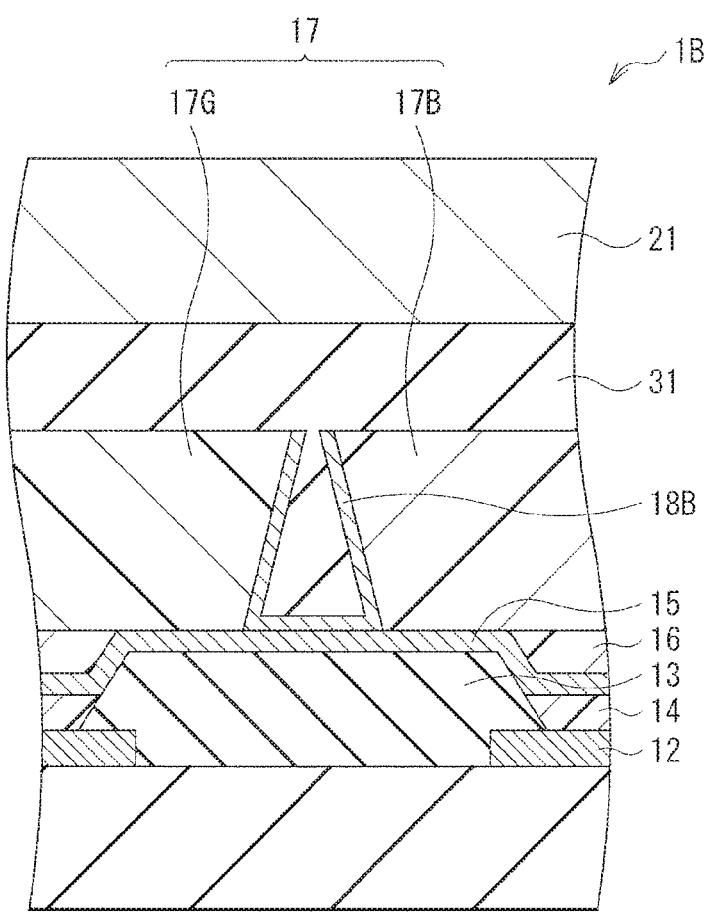

[ FIG. 5 ]
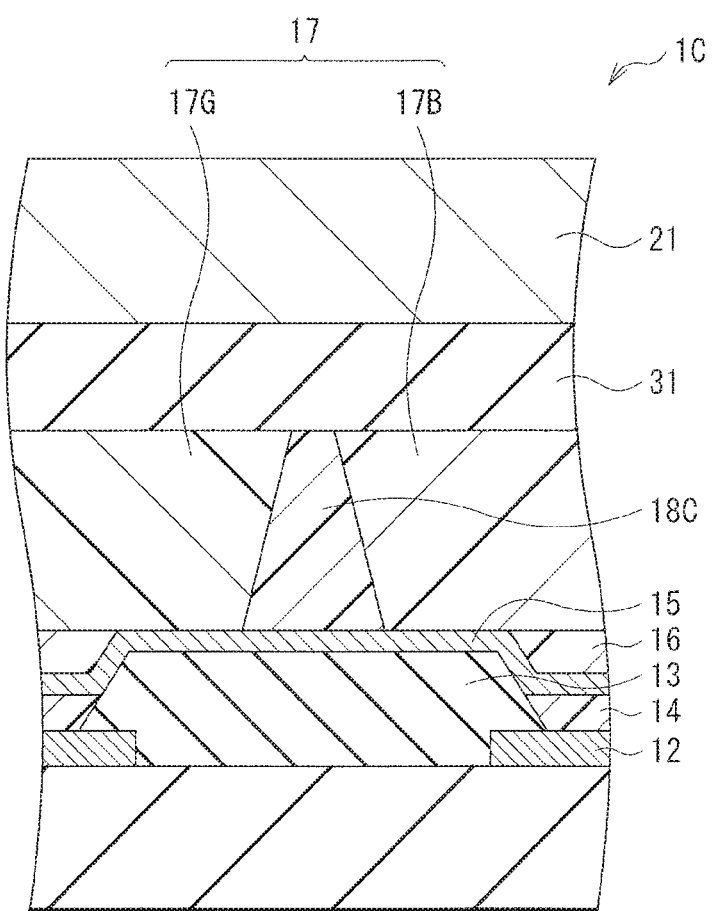

[ FIG. 6 ]
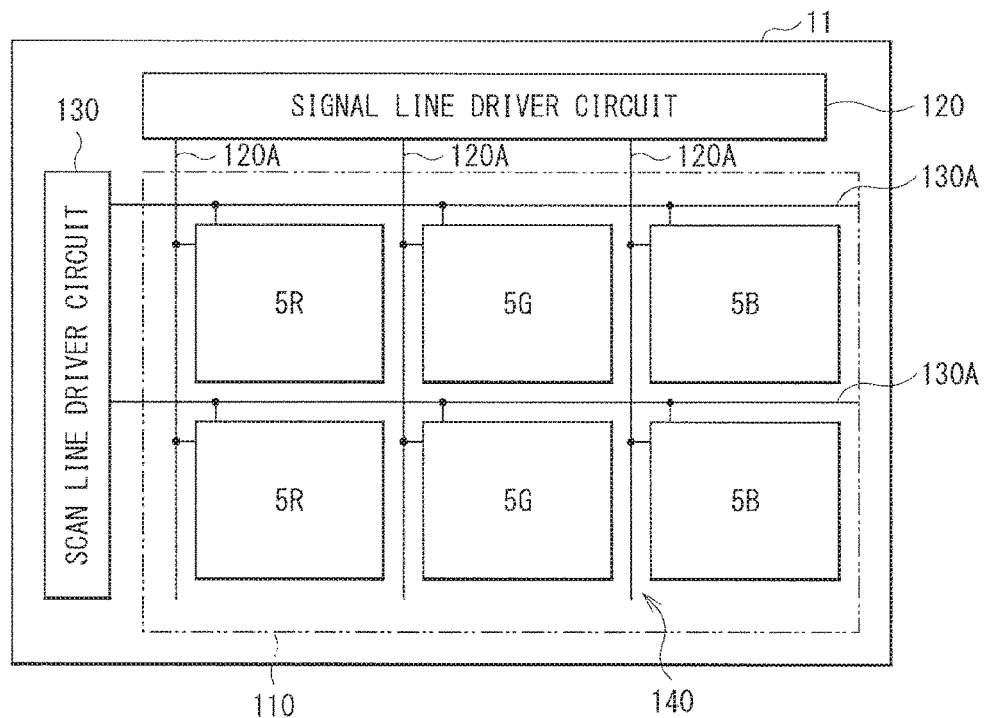
[ FIG. 7 ]
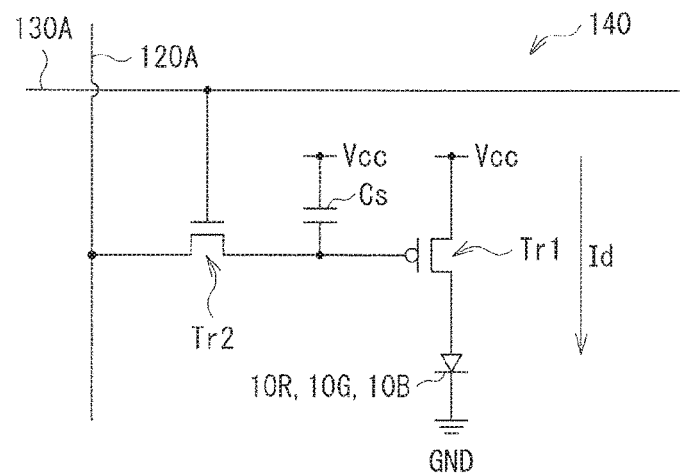

[ FIG. 8 ]
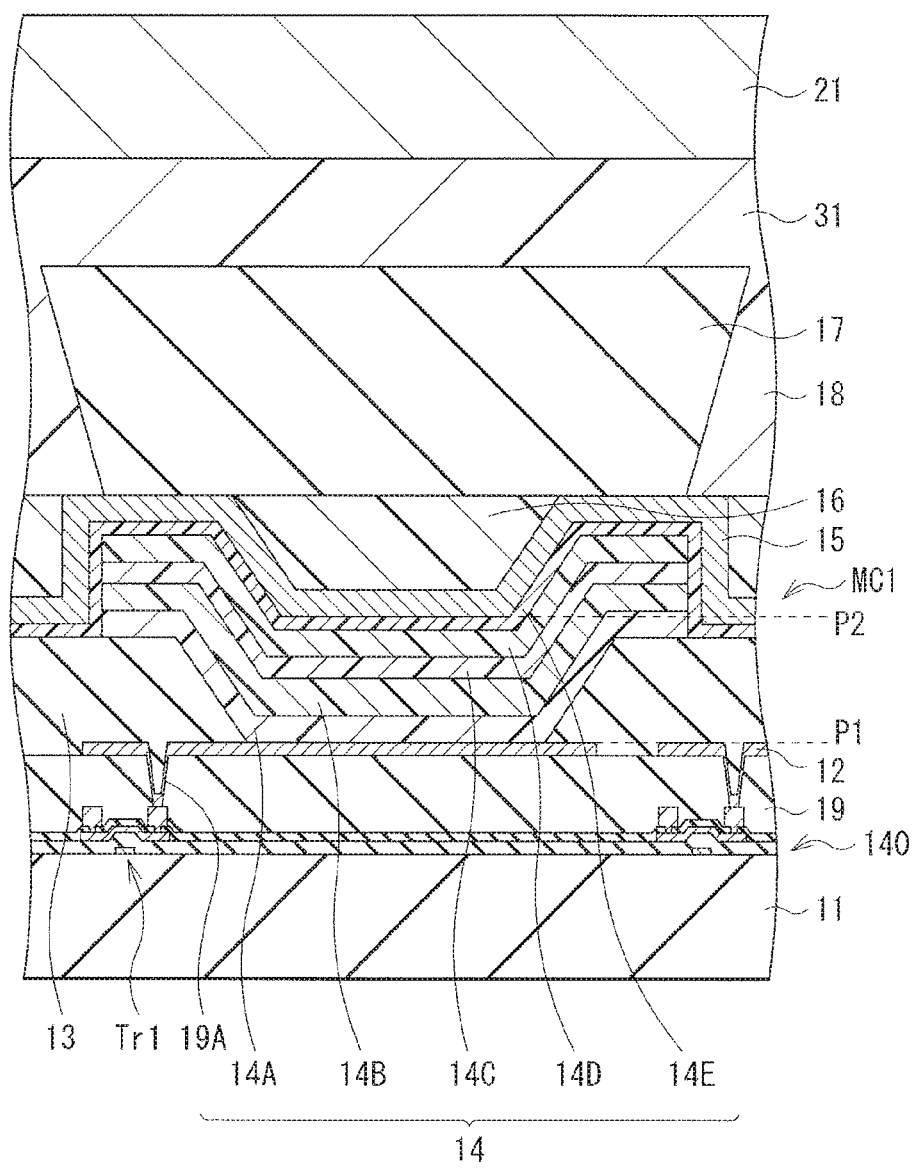

[ FIG. 9 ]
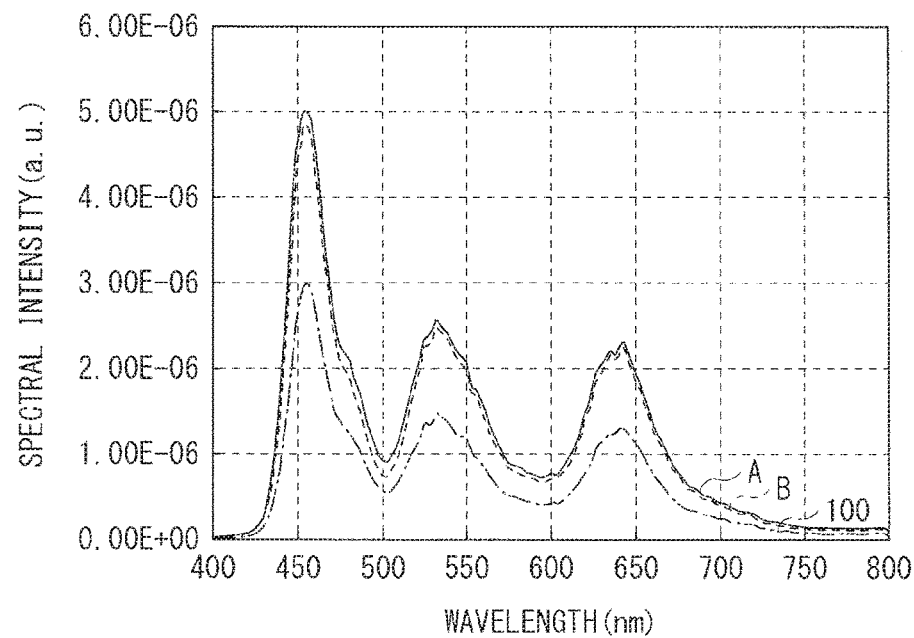
[ FIG. 10 ]
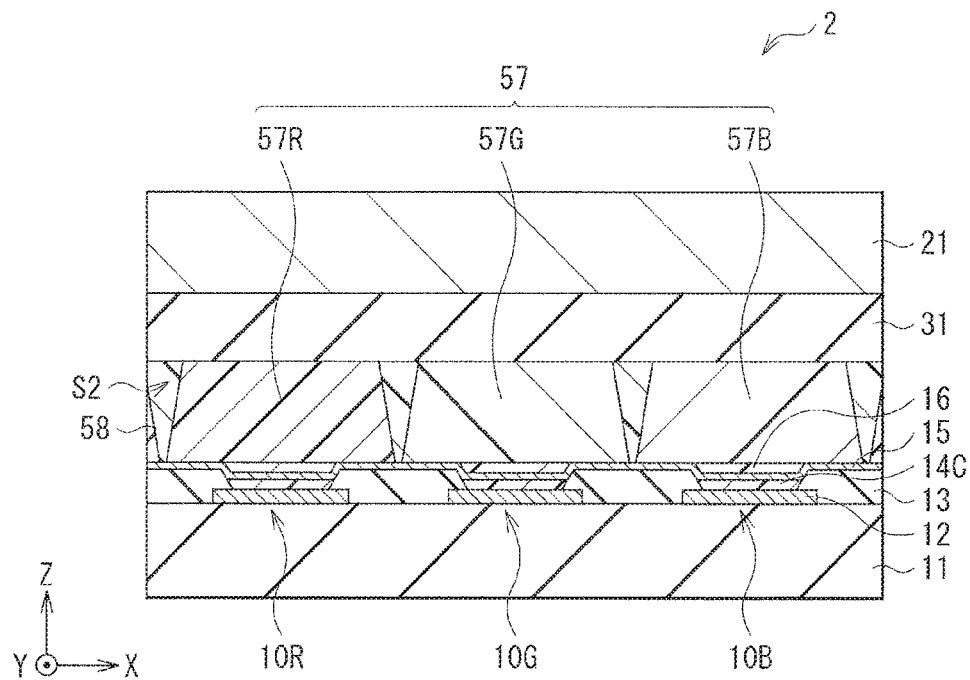

[ FIG. 11 ]
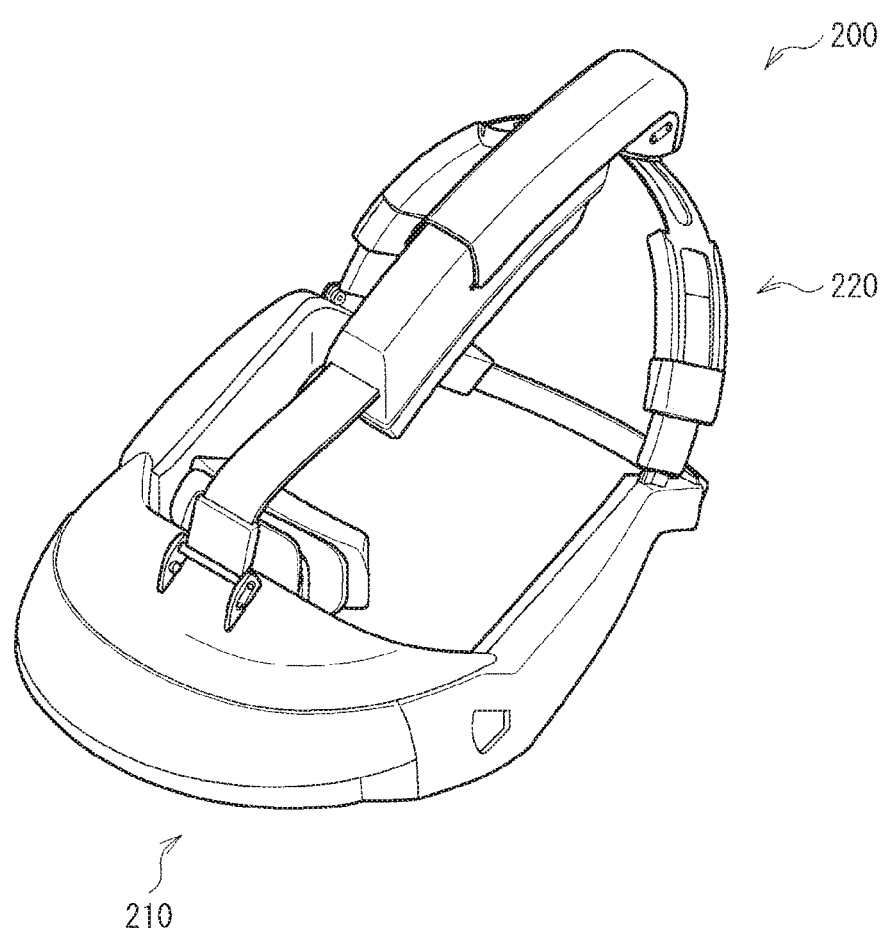

[ FIG. 12A ]
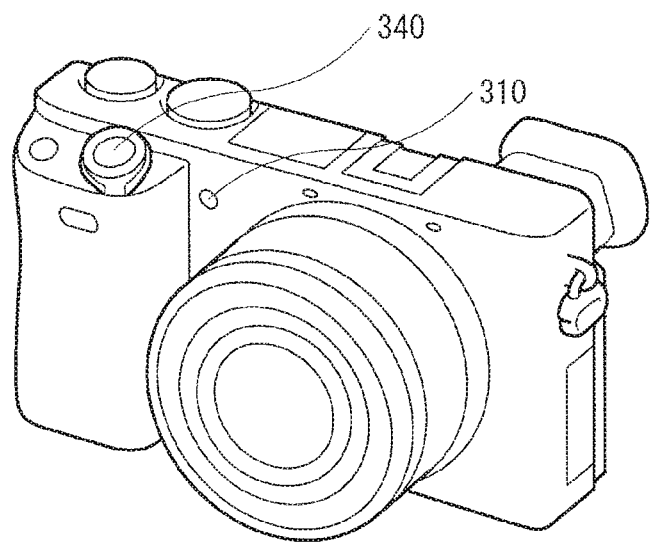
[ FIG. 12B ]
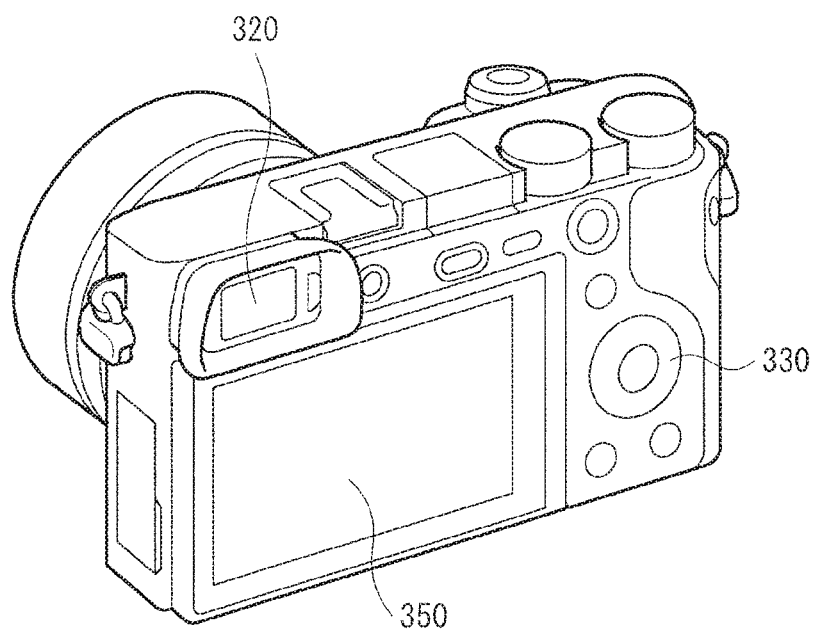

DISPLAY DEVICE AND ELECTRONIC APPARATUS

CROSS REFERENCE TO RELATED APPLICATIONS

This application is a U.S. National Phase of International Patent Application No. PCT/JP2015/069853 filed on Jul. 10, 2015, which claims priority benefit of Japanese Patent Application No. JP 2014-167195 filed in the Japan Patent Office on Aug. 20, 2014. Each of the above-referenced applications is hereby incorporated herein by reference in its entirety.

TECHNICAL FIELD

The disclosure relates to a display device that emits light with utilization of an organic electroluminescence (EL) phenomenon, and an electronic apparatus including the display device.

BACKGROUND ART

In a display device utilizing spontaneous light emitting elements such as organic EL elements, there has been pursuit of suppression of color mixture, enhanced efficiency of light emission, and longer drive lifetime. In a general display device, light emission elements may be provided on one of a pair of substrates, whereas a light-shielding black matrix may be provided on another of the pair of substrates. This allows for the suppression of the color mixture between adjacent pixels, but there are disadvantages such as an increase in a reflected component of external light and lowered efficiency of light extraction.

PTL 1 therefore discloses, for example, a so-called on-chip lens (OCL) structure, for purpose of enhancement in the efficiency of the light extraction. In the OCL structure, a microlens may be disposed on a substrate on side on which light is extracted.

CITATION LIST

Patent Literature

[PTL 1] Japanese Unexamined Patent Application Publication No. 2011-022432

SUMMARY OF THE INVENTION

However, in order to extract light efficiently in the display device provided with the on-chip lens structure, there may be involved requests for disposing a light emission plane in a focal plane of the microlens and allowing the light emission to occur near an optical axis. In response to the requests, an aperture size of the pixels may be reduced, and a width of an insulating film that separates the pixels (a partition wall) may be increased. Such a display device may have a disadvantage that necessary current density becomes larger, causing an increase in power consumption. Thus, it is difficult to enhance the efficiency of the light extraction while suppressing the color mixture.

It is therefore desirable to provide a display device and an electronic apparatus that make it possible to enhance efficiency of light extraction and to suppress color mixture between adjacent pixels.

A display device according to an embodiment of the disclosure includes a first substrate that includes light emitting elements and color elements for respective pixels, in which the color elements are provided over the light emitting elements. The color elements include: a color element of one color including a first edge face; a color element of another color including a second edge face, in which the second edge face is adjacent to the first edge face, and at least the first edge face and the second edge face each have inclination; and a reflector structure provided in a gap formed by the inclination.

An electronic apparatus according to an embodiment of the disclosure includes the display device as described above.

In the display device and the electronic apparatus according to the embodiments of the disclosure, on the first substrate, the color elements are provided over the light emitting elements provided for respective pixels. The color elements include the color element of one color including the first edge face, and the color element of another color including the second edge face, in which the second edge face is adjacent to the first edge face. At least the first edge face and the second edge face each have the inclination. The reflector structure is provided in the gap formed by the inclination of the first edge face and the second edge face. This causes emission light to be reflected by the reflector structure toward the color elements provided over the spontaneous light emitting elements. As used here, the emission light refers to light emitted from the light emission elements at a large angle with respect to a direction of light extraction. Thus, the emission light is kept from intruding into the adjacent color element of another color.

According to the display device and the electronic apparatus of the embodiments of the disclosure, the color elements are disposed over the light emitting elements provided for respective pixels. In the color elements, at least the edge faces (the first edge face and the second edge face) each have inclined planes, in which the edge faces each are adjacent to the color element of another color. The reflector structure is provided between the edge faces. This causes the emission light to be reflected by the reflector structure toward the color elements over the spontaneous light emitting elements. As used here, the emission light refers to the light emitted from the light emission elements at the large angle with respect to the direction of the light extraction. Hence, it is possible to enhance efficiency of the light extraction, without forming a black matrix. Moreover, the emission light is kept from intruding into the adjacent color element of another color. Hence, it is possible to suppress color mixture between adjacent pixels. It is to be noted that some effects described here are not necessarily limitative, and any of other effects described herein may be achieved.

BRIEF DESCRIPTION OF DRAWINGS

FIG. 1 is a cross-sectional view of a configuration of a display device according to an embodiment of the disclosure.

FIG. 2 is a cross-sectional view of one example of a reflector structure in the display device illustrated in FIG. 1.

FIG. 3 is a cross-sectional view of another example of the reflector structure in the display device illustrated in FIG. 1.

FIG. 4 is a cross-sectional view of another example of the reflector structure in the display device illustrated in FIG. 1.

FIG. 5 is a cross-sectional view of another example of the reflector structure in the display device illustrated in FIG. 1.

FIG. 6 is a diagram illustrating a configuration of the display device illustrated in FIG. 1.

FIG. 7 is a diagram illustrating one example of a pixel driver circuit illustrated in FIG. 2.

FIG. 8 is a cross-sectional view of one example of a light emitting element provided in the display device illustrated in FIG. 1.

FIG. 9 is a characteristic diagram illustrating efficiency of light extraction in the display device illustrated in FIG. 4 and in a display device as a comparative example.

FIG. 10 is a cross-sectional view of a configuration of a pixel according to a modification example.

FIG. 11 is a perspective view of an external appearance of an application example 1 of a display device with utilization of a pixel according to the example embodiments as mentioned above.

FIG. 12A is a perspective view of an external appearance of an application example 2, as viewed from front side.

FIG. 12B is a perspective view of an external appearance of the application example 2, as viewed from rear side.

MODES FOR CARRYING OUT THE INVENTION

In the following, some embodiments of the disclosure are described in detail with reference to the drawings. It is to be noted that description is given in the following order.
1. Embodiment (a display device including color elements with edge faces in a reverse taper)
1.1 Basic Configuration
1.2 Overall Configuration
1.3 Workings and Effects
2. Modification Example (a display device including color elements with edge faces in a forward taper)
3. Application Examples (examples of electronic apparatuses)

[1. Embodiment]
[1.1 Basic Configuration]

FIG. 1 illustrates a cross-sectional configuration of a display device (a display device 1) according to an embodiment of the disclosure. The display device 1 may be used in, for example, a small-sized display, e.g., a so-called head mount display that may be worn on a head. The display device 1 may have a configuration in which a plurality of pixels 5 are disposed in rows and columns (in a matrix) in a display region 110 (refer to FIG. 6). The pixels 5 (5R, 5G and 5B) may respectively include, for example, a red light emitting element 10R, a green light emitting element 10G and a blue light emitting element 10B. The red light emitting element 10R may generate red monochromatic light. The green light emitting element 10G may generate green monochromatic light. The blue light emitting element 10B may generate blue monochromatic light. The light emitting elements 10R, 10G and 10B may each include, for example, an organic EL element as described later. In one alternative, the light emitting elements 10R, 10G 10B may each include, for example, an inorganic EL element, a semiconductor laser, or an LED (a light emitting diode).

The display device 1 may have a so-called on-chip color filter (OCCF) structure. In the OCCF structure, color elements (color filters 17R, 17G and 17B) are provided over the respective light emitting elements 10R, 10G and 10B provided on the driver substrate 11. In this embodiment, an edge face of the color filter 17R, 17G or 17B has inclination, in which the edge face is adjacent to the color filter of another color. In one specific example, the edge face of the color filter 17R, 17G or 17B may have an inclined plane S1 in a reverse taper, in which the edge face is disposed adjacent to the color filter of a different color. A gap is formed by the inclined planes S1, between the color filters 17R, 17G and 17B. In the gap, provided is a reflector structure 18.

The reflector structure 18 may keep emission light from intruding into the color filter 17R, 17G or 17B provided over the adjacently-disposed light emitting element of another color, and suppress color mixture. As used here, the emission light refers to light emitted from light emitting layers 14C of the respective light emitting elements 10R, 10G and 10B. The reflector structure 18 is provided in the gap formed by the inclination of the edge face of the color filter 17R, 17G or 17B, in which the edge face is adjacent to the color filter of another color, as described above. In specific examples, the reflector structure 18 may have configurations (reflector structures 18A, 18B, and 18C) as illustrated in FIGS. 2 to 5.

Referring to FIG. 2, the reflector structure 18A in a display device 1A may include, for example, a low refractive-index resin filled in the gap formed by the inclined planes S1 of the color filters 17R, 17G and 17B. As used here, the term "low refractive index" means being lower than a refractive index of the color filters 17R, 17G and 17B. Allowing a refractive index of the reflector structure 18A to be lower than the refractive index of the color filters 17R, 17G and 17B causes the emission light to be reflected at the inclined planes S1 of the color filters 17R, 17G and 17B (an interface between the color filter 17 and the reflector structure 18) toward the color filters provided over the spontaneous light emitting elements. As used here, the emission light refers to light emitted from the light emitting layers 14C of the respective light emitting elements 10R, 10G and 10B at a large angle with respect to a direction of light extraction (a direction of a Z axis). In other words, the emission light as used here refers to emission light that may possibly cause the color mixture (obliquely emitted light). The emission light thus reflected is emitted to outside, leading to enhancement in efficiency of the light extraction. Moreover, the emission light is suppressed from entering the adjacently-disposed color filter of another color, leading to reduction in the color mixture.

It is to be noted that in this example, the color filters 17R, 17G and 17B may have the inclined planes S1 in the reverse taper, and the inclined planes S1 may be spaced apart to provide a clearance between upper parts of the inclined planes S1. However, as illustrated in FIG. 3, the upper parts of the inclined planes S1 may be in contact with one another. To process the upper parts of the inclined planes S1 of the adjacent color filters so as to be in contact with one another makes it possible to increase widths of the color filters 17R, 17G and 17B provided over the respective light emitting elements 10R, 10G and 10B. This leads to an increase in area of the light extraction, and further enhancement in the efficiency of the light extraction.

Referring to FIG. 4, the reflector structure 18B in a display device 1B may include a film formed on a surface of the inclined planes S1 of the color filters 17R, 17G and 17B. The film may have light reflecting property or light shielding property. The light-reflecting film (or the light-shielding film) may be formed by, for example, atomic layer deposition (ALD). Examples of a material of the light-reflecting film may include an inorganic material having the light reflecting property, e.g., aluminum (Al) and silver (Ag). The light-reflecting film may have a film thickness enough to reflect the emission light emitted from the light emitting layers 14C. In one preferable example, the film thickness may be 30 nm to 500 nm both inclusive.

Referring to FIG. 5, the reflector structure 18C in a display device 1C may include a material filled in the gap formed by the inclined planes S1 of the color filters 17R, 17G and 17B. The material may have light shielding property (or light absorbing property). Examples of the material may include a pigment, a black resin material that is mixed with a black colorant and has optical density of 1 or more, and a metal oxide such as titanium oxide.

[1-2. Overall Configuration]

FIG. 6 illustrates an overall configuration of the display device 1. The display device 1 may include the organic EL elements that serve as the light emitting elements 10R, 10G, and 10B, as described above. The display device 1 may include, for example, a signal line driver circuit 120 and a scan line driver circuit 130 around the display region 110. The signal line driver circuit 120 and the scan line driver circuit 130 may serve as drivers for picture display.

A pixel driver circuit 140 may be provided in the display region 110. FIG. 7 illustrates one example of the pixel driver circuit 140. The pixel driver circuit 140 may be an active type driver circuit formed in a lower layer of a pixel electrode 12 as described later. Specifically, the pixel driver circuit 140 may include a drive transistor Tr1 and a write transistor Tr2, a capacitor (a retention capacitance) Cs between these transistors Tr1 and Tr2, and the light emitting element 10R (or 10G or 10B). The light emitting element 10R, 10G or 10B may be coupled in series to the drive transistor Tr1, between a first power supply line (Vcc) and a second power supply line (GND). The drive transistor Tr1 and the write transistor Tr2 may each include a general thin film transistor. There is no particular limitation in configurations of the transistors. The transistors may be, for example, of an inverted staggered structure (a so-called bottom gate type), or of a staggered structure (a so-called top gate type).

In the pixel driver circuit 140, a plurality of signal lines 120A may be disposed in a column direction, while a plurality of scan lines 130A may be disposed in a row direction. Intersections of the signal lines 120A and the scan lines 130A may each correspond to any one of the light emitting elements 10R, 10G and 10B (a subpixel). Each of the signal lines 120A may be coupled to the signal line driver circuit 120. An image signal may be supplied to a source electrode of the write transistor Tr2 from the signal line driver circuit 120 through the signal lines 120A. Each of the scan lines 130A may be coupled to the scan line driver circuit 130. A scan signal may be sequentially supplied to a gate electrode of the write transistor Tr2 from the scan line driver circuit 130 through the scan lines 130A.

FIG. 8 illustrates a cross-sectional configuration of the light emitting elements 10R, 10G and 10B. The light emitting elements 10R, 10G and 10B may each be a light emitting element in which the drive transistor Tr1 of the pixel driver circuit 140 as described above, a planarization insulating film 19, the pixel electrode 12, a partition wall 13, an organic layer 14 including the light emitting layer 14C as described later, and an opposite electrode 15 are stacked in the order named from side on which the pixel substrate 11 is disposed. The pixel electrode 12 may serve as an anode. The opposite electrode 15 may serve as a cathode. The drive transistor Tr1 may be electrically coupled to the pixel electrode 12 through a contact hole 19A provided in the planarization insulating film 19.

The color filters 17R, 17G and 17B as described above may be provided over the light emitting elements 10R, 10G and 10B, with a protective film 16 in between. The protective film 16 may be made of, for example, silicon nitride (SiNx), silicon oxide, or a metal oxide. The light emitting elements 10R, 10G and 10B over which the color filters 17R, 17G, and 17B are provided may be bonded to an opposite substrate 21, with a sealing layer 31 in between. Thus, the light emitting elements 10R, 10G and 10B may be sealed between the pixel substrate 11 and the opposite substrate 21.

Configurations of members that constitute the display device 1 may be as follows.

The planarization insulating film 19 may planarize a surface of the pixel substrate 11 on which the pixel driver circuit 140 is formed. In one preferable example, the planarization insulating film 19 may be made of a material having an optimal patterning precision because the minute contact hole 19A is provided therein. Examples of a constituent material of the planarization insulating film 19 may include an organic material such as polyimide, and an inorganic material such as silicon oxide ($SiO_2$).

The pixel electrode 12 may also serve as a reflection film. In one preferable example, the pixel electrode 12 may have as high reflectivity as possible in terms of enhancement in efficiency of light emission. In particular, in one preferable example, when the pixel electrode 12 is used as the anode, the pixel electrode 12 may be made of a material having high hole injecting property. The pixel electrode 12 may have, for example, a thickness in a stacking direction (hereinafter, simply referred to as a thickness) of 100 nm to 1000 nm both inclusive, and be made of, for example, a simple substance or an alloy of metal elements such as chromium (Cr), gold (Au), platinum (Pt), nickel (Ni), copper (Cu), tungsten (W), and silver (Ag). A transparent conductive film such as an oxide of indium and tin (ITO) may be provided on a surface of the pixel electrode 12. It is to be noted that providing an appropriate hole injection layer makes it possible to utilize, as the pixel electrode 12, materials such as an aluminum (Al) alloy that have high reflectance but have a disadvantage of a hole injection barrier due to presence of a surface oxide film or a small working function.

The partition wall 13 may ensure insulation between the pixel electrode 12 and the opposite electrode 15, and provide a light emission region of a desired shape. The partition wall 13 may be made of, for example, a photosensitive resin. The partition wall 13 may be provided solely around the pixel electrode 12, so as to allow a region exposed from the partition wall 13, of the pixel electrode 12, to serve as the light emitting region. It is to be noted that the organic layer 14 and the opposite electrode 15 may be provided over the partition wall 13, but the light emission may occur solely in the light emission region.

The organic layer 14 may have a configuration in which, for example, a hole injection layer 14A, a hole transportation layer 14B, the light emitting layer 14C, an electron transportation layer 14D, and an electron injection layer 14E are stacked in the order named from side on which the pixel electrode 12 is disposed. Among these layers, the layers other than the light emitting layer 14C may be provided as necessary. The organic layer 14 may have different configurations for light emission colors of the light emitting elements 10R, 10G and 10B. The hole injection layer 14A may enhance efficiency of hole injection, and serve as a buffer layer that prevents a leak. The hole transportation layer 14B may enhance efficiency of hole transportation to the light emitting layer 14C. The light emitting layer 14C may generate light by re-combination of electrons and holes by application of electric field. The electron transportation layer 14D may enhance efficiency of electron transportation to the light emitting layer 14C. The electron injection layer 14E may enhance efficiency of electron injection.

The hole injection layer 14A of the light emitting element 10R may have the thickness of, for example, 5 nm to 300 nm both inclusive, and be made of, for example, a hexaazatriphenylene derivative. The hole transportation layer 14B of the light emitting element 10R may have the thickness of, for example, 5 nm to 300 nm both inclusive, and be made of, for example, bis[(N-naphtyl)-N-phenyl] benzydine (α-NPD). The light emitting layer 14C of the light emitting element 10R may have the thickness of, for example, 10 nm to 100 nm both inclusive, and be made of a mixture in which 40 vol % of 2,6-bis[4-[N-(4-methoxyphenyl)-N-phenyl) aminostyril]naphthalene-1,5-dicarbonitrile (BSN-BCN) is mixed in 8-quinolinol aluminum complex (Alq3). The electron transportation layer 14D of the light emitting element 10R may have the thickness of, for example, 5 nm to 300 nm both inclusive, and be made of Alq3. The electron injection layer 14E of the light emitting element 10R may have the thickness of, for example, about 0.3 nm, and be made of, for example, LiF or $Li_2O$.

The opposite electrode 15 may have the thickness of, for example, about 10 nm, and be made of an alloy of aluminum (Al), magnesium (Mg), calcium (Ca), or sodium (Na). Among these, a preferable example may be an alloy of magnesium and silver (a Mg—Ag alloy) because of conductivity as a thin film and small absorption. There is no particular limitation in a ratio of magnesium and silver in the Mg—Ag alloy. In one preferable example, a ratio by the film thickness may be in a range of Mg:Ag=20:1 to 1:1 both inclusive. Moreover, an alternative of a material of the opposite electrode 15 may be an alloy of aluminum (Al) and lithium (Li) (an Al—Li alloy).

The opposite electrode 15 may also serve as a semi-transparent reflection layer. This causes formation of a microcavity structure MC1 inside the light emitting element 10, as illustrated in FIG. 8. The microcavity structure MC1 may cause light generated in the light emitting layer 14C to resonate between the pixel electrode 12 and the opposite electrode 15. The microcavity structure MC1 may cause the resonance of the light generated in the light emitting layer 14C, with an interface between the pixel electrode 12 and the organic layer 14 serving as a reflection plane P1, with an interface between the opposite electrode 15 and the electron injection layer 14E serving as a semi-transparent reflection plane P2, and with the organic layer 14 serving as an resonance part. The microcavity structure MC1 may cause the resonated light to be extracted from side on which the semi-transparent reflection plane P2 is disposed. Providing the microcavity structure MC1 in this way makes it possible to cause multiple interference of the light generated in the light emitting layer 14C, to decrease a half width of a spectrum of the light extracted from the side on which the semi-transparent reflection plane P2 is disposed, and to increase peak intensity. In other words, it is possible to increase intensity of luminous radiation in a front direction, and to enhance color purity of the light emission.

The protective film 16 may protect the light emitting elements 10R, 10G and 10B. The protective film 16 may be made of, for example, an inorganic material such as silicon oxide (SiOx), silicon nitride (SiNx), silicon oxide nitride (SiNxOy), titanium oxide (TiOx), and aluminum oxide (AlOx).

The color filters 17R, 17G and 17B may improve the color purity, in extracting the light generated in the light emitting elements 10R, 10G and 10B, and by absorbing the external light. The color filter 17 may include, for example, the color filters 17R, 17G and 17B of colors corresponding to the light emission colors of the light emitting elements 10R, 10G and 10B. The color filters 17R, 17G and 17B may be provided over the respective light emitting elements 10R, 10G 10B. The color filters 17R, 17G and 17B may each have a shape of, for example, a rectangle, in a plan view (as viewed in the direction of the Z axis). The color filters 17R, 17G and 17B may each have a shape of, for example, a trapezoid, in a cross-sectional view (as viewed in a direction of a Y axis or a direction of an X axis), in which the edge face may have the inclination in the reverse taper with respect to the direction of the light extraction along the Z axis, in which the edge face is adjacent to the color filter of another color. The color filters 7R, 17G and 17B may each be made of, for example, a resin mixed with a pigment. Selecting the pigment permits adjustment so that light transmittance is increased in a target wavelength region of, for example, red, green, or blue, and decreased in other wavelength regions.

The sealing layer 31 may be formed in a substantially uniform state on the color filter 17. The sealing layer 31 may also serve as an adhesive layer that bonds the pixel electrode 11 and the opposite substrate 21 together, and be made of a resin material such as an epoxy resin and an acrylic resin. It is to be noted that using the low refractive index resin as the sealing layer 31 makes it possible to form the sealing layer 31 and the reflector structure 18 in a same process. Moreover, it is not necessary to provide the sealing layer 31 over an entire surface between the color filter 17 and the opposite substrate 21. For example, the resin material may be applied solely around the display region 110, to provide a hollow structure between the color filter 17 and the opposite substrate 21 inside the display region 110.

The display device 1 may be manufactured, for example, as follows.

First, the pixel driver circuit 140 including the drive transistor Tr1 may be formed on the pixel substrate 11 made of the material as described above. Thereafter, the photosensitive resin may be applied to an entire surface, to form the planarization insulating film 19. Exposure and development may allow for patterning of the planarization insulating film 19 into a predetermined shape and formation of the contact hole 19A. Thereafter, baking may be carried out.

Thereafter, the pixel electrode 12 may be formed by, for example, a sputtering method. The material thereof may be as described above. The pixel electrode 12 may be selectively removed by wet etching, and separated for each of the light emitting elements 10R, 10G and 10B. Thereafter, a photosensitive resin may be applied to the entire surface of the pixel substrate 11. Apertures corresponding to the light emitting regions may be provided by, for example, a photolithography method. Baking may be carried out to form the partition wall 13.

Thereafter, the hole injection layer 14A, the hole transportation layer 14B, the light emitting layer 14C, and the electron transportation layer 14D of the organic layer 14 may be formed by, for example, a vapor deposition method. The thicknesses and the materials thereof may be as described above. After the formation of the organic layer 14, the opposite electrode 15 may be deposited by, for example, the vapor deposition method. The thickness and the material thereof may be as described above. Thus, the light emitting elements 10R, 10G and 10B as illustrated in FIG. 8 may be formed. Thereafter, the protective film 16 may be formed on the light emitting elements 10R, 10G and 10B by, for example, a CVD method or the sputtering method. The material thereof may be as described above.

Thereafter, the material of the color filter 17 may be applied to the protective film 16 by, for example, spin coating. Patterning by a photolithography technique with use of a negative photoresist may cause formation of the color filters 17R, 17G and 17B in which the edge faces as illustrated in FIG. 1 and other figures may have the inclined planes S1 in the reverse taper. Thereafter, the reflector structure 18 may be formed in the gap formed by the inclination of the edge faces of the color filters 17R, 17G and 17B. In one specific example, referring to FIG. 4, the reflector structure 18B including the reflection film may be formed as follows. For example, Al may be deposited with use of the ALD method, as a continuous film over a surface of the color filter 17 including the edge faces and over a bottom surface of the gap (on the opposite electrode 16). Thereafter, the reflection film deposited on the color filter 17 may be polished and removed by, for example, a CMP (chemical mechanical polishing) method. It is to be noted that it is not necessary to completely remove the reflection film on the color filter 17. The reflection film on the color filter 17 may be thinned so as not to shield the emission light emitted from the light emitting layers 14C. Moreover, referring to FIG. 5, in a case with the reflector structure 17C formed by filling the pigment or other substances, a coating of the pigment or other substances formed on the color filter 17 may be removed or thinned as appropriate, as with the case of the reflector structure 18B.

Lastly, the sealing layer 31 may be formed on the color filter 17. The bonding of the opposite substrate 21 may be made, with the sealing layer 31 in between. Thus, the display device 1 as illustrated in FIGS. 1 to 8 may be completed. It is to be noted that in a case with the use of the low refractive index resin as the material of the sealing layer 31, it is possible to form the reflector structure 18 and the sealing layer 31 in the same process, leading to reduction of the number of the processes.

In the display device 1, the scan signal may be supplied to each of the pixels 5 from the scan line driver circuit 130 through the gate electrode of the write transistor Tr2. Meanwhile, the image signal may be retained in the retention capacitance Cs from the signal line driver circuit 120 through the write transistor Tr2. In other words, the drive transistor Tr1 may be on-off controlled in response to the signal retained by the retention capacitance Cs. Thus, a drive current Id may be injected into the light emission elements 10R, 10G and 10B, causing the light emission by the recombination of the holes and the electrons. The light may be subjected to the multiple interference between the pixel electrode 12 (the refection plane P1) and the opposite electrode 15 (the semi-transparent reflection plane P2) in a case with the microcavity structure MC1. Alternatively, the light reflected by the pixel electrode 12 (the reflection plane P1) and the light generated in the light emitting layer 14C may enhance each other by interference. The light may pass through the opposite electrode 15, the color filter 23, and the opposite substrate 21 and be extracted.

[1-3. Workings and Effects]

As described above, in the display device utilizing the spontaneous light emitting elements such as the organic EL elements, the emission light having the large angle with respect to the direction of the light extraction may enter the color filter provided over the adjacently-disposed light emitting element of another color, and cause the color mixture. In a general display device, for example, a light-shielding black matrix may be provided on a substrate on side on which light is extracted, so as to suppress the color mixture. However, there are disadvantages such as an increase in a reflected component of the external light and lowered efficiency of the light extraction. One possible measure to be taken to enhance the efficiency of the light extraction may be to dispose an on-chip lens on the substrate through which the light is extracted. However, this may involve requests for reducing an aperture size of the pixels and disposing a light emission plane in a focal plane of the microlens, in order to extract the light more effectively. Therefore, although the efficiency of the light extraction is improved, there is a disadvantage that necessary current density becomes larger, causing an increase in power consumption.

In contrast, in this embodiment, the color filters 17R, 17G and 17B are provided over the light emitting elements 10R, 10G and 10B. The edge face of the color filter 17R, 17G or 17B may have the inclination in the reverse taper, in which the edge face is adjacent to the color filter of another color. The reflector structure 18 is provided in the gap formed by the inclined edge faces (the inclined planes S1). FIG. 9 is a characteristic diagram that illustrates effects of the light extraction in the display devices 1A and 1B, and in a display device 100. The display device 100 may be a general display device (a comparative example) having a configuration in which edge faces of adjacent color filters are in contact with each other over their entire surfaces. As seen from FIG. 9, the display devices 1A and 1B have higher spectral intensity than that of the display device 100, which gives an understanding of enhancement in efficiency of extraction.

As described, in this embodiment, the color filters 17R, 17G and 17B are provided over the light emitting elements 10R, 10G and 10B. The edge face of the color filter 17R, 17G or 17B may have the inclination in the reverse taper (the inclined plane S1), in which the edge face is adjacent to the color filter of another color. The reflector structure 18 (18A, 18B, and 18C) is provided in the gap formed by the inclined planes S1. This causes the obliquely emitted light to be reflected by the reflector structure 18. The obliquely emitted light refers to light that may possibly enter the adjacent color filter 17R, 17G or 17B of another color, out of the emission light emitted from the light emitting layer 14C. In other words, it is possible to suppress the color mixture between the adjacent pixels, without forming a light-shielding member such as a black matrix in a general display device. Moreover, the obliquely emitted light is reflected toward the color filters provided over the spontaneous light emitting elements, and thereafter, emitted to the outside. This makes it possible to enhance the efficiency of the light extraction. Hence, it is possible to provide an electronic apparatus in which the efficiency of the light extraction is enhanced and the color mixture between the adjacent pixels is suppressed.

In one alternative, the color filters 17R, 17G and 17B may have the inclination in the reverse taper, not only at the edge face adjacent to the color filter of another color, but also at the edge face adjacent to the color filter of a same color. Thus, all the edge faces of the color filters 17R, 17G and 17B of the respective pixels may have the inclination. This leads to further enhancement in the efficiency of the light extraction.

Description is given next of a modification example of the forgoing embodiment. In what follows, components similar to those of the forgoing embodiment are denoted by same reference characters, and description thereof is omitted as appropriate.

[2. Modification Example]

FIG. 10 illustrates a cross-sectional configuration of a display device (a display device 2) according to a modification example of the disclosure. The display device 2 may be different from the forgoing embodiment in that an edge face of a color filter 57R, 57G or 57B may have inclination in a forward taper, in which the edge face is adjacent to the color filter of another color. The color filters 57R, 57G and 57B are provided over the light emitting elements 10R, 10G and 10B. A gap is provided by inclined planes S1 in the forward taper. In the gap, provided is a reflector structure 58.

The reflector structure 58 may have a similar configuration to those of the reflector structure 18 (18A, 18B, and 18C) in the forgoing embodiment. Thus, providing the inclined plane S2 in the forward taper at the edge face of the color filter 57R, 57G or 57B, in which the edge face is adjacent to the color filter of another color, makes it possible to produce similar effects to those of the forgoing embodiment.

[3. Application Examples]

The display devices 1 and 2 as described in the forgoing embodiment and the modification example may be applied to display devices of electronic apparatuses in various fields that display an image or a picture on the basis of a picture signal inputted from outside or a picture signal generated inside. Examples may include a television set, a digital camera, a notebook personal computer, a mobile terminal device such as a mobile phone, and a video camera. In particular, the display devices 1 and 2 may be suitably applied to a medium-sized or small-sized display for mobile applications. Some examples are given in the following.

FIG. 11 illustrates an external appearance of a head mount display 200 according to an application example 1. The head mount display 200 may include a display unit 210 (the display device 1 or 2) and a mounting unit 220.

FIGS. 12A and 12B respectively illustrate external appearances of a front surface and a rear surface of a digital still camera according to an application example 2. The digital still camera may include, for example, a lighting unit 310 for flashlight, a viewfinder 320 (the display device 1 or 2), a menu switch 330, a shutter button 340, and a display unit 350.

Although description has been made by giving the embodiment and the modification example as mentioned above, the contents of the disclosure are not limited to the above-mentioned example embodiments and may be modified in a variety of ways. For example, materials and thicknesses, or deposition methods and deposition conditions, etc. of the layers as described in the forgoing example embodiments are not limited to as exemplified above, but other materials and thicknesses, or other deposition methods and deposition conditions may be adopted.

Furthermore, it is not necessary to provide all the layers as described in the forgoing example embodiments, but some layers may be omitted as appropriate. Moreover, it is possible to provide additional layers other than the layers as described in the forgoing example embodiments. For example, one or more layers may be additionally interposed between the charge transportation layer 17 and the blue light emitting layer 14B. The one or more layers may utilize a material having hole transportation capability, as with the common hole transportation layer as disclosed in Japanese Unexamined Patent Application Publication No. 2011-233855. The addition of the one or more layers leads to enhancement in efficiency of the light emission and life characteristics of the blue light emitting element 10B.

It is to be noted that effects described herein are merely exemplified and not limitative, and effects of the disclosure may be other effects or may further include other effects.

It is to be noted that the technology may have configurations as follows.

(1) A display device, including a first substrate that includes light emitting elements and color elements for respective pixels, the color elements being provided over the light emitting elements,
the color elements include:
  a color element of one color including a first edge face;
  a color element of another color including a second edge face, the second edge face being adjacent to the first edge face, and at least the first edge face and the second edge face each having inclination; and
  a reflector structure provided in a gap formed by the inclination.

(2) The display device according to (1), wherein the reflector structure has light absorbing property.

(3) The display device according to (1) or (2), wherein the reflector structure has light reflecting property.

(4) The display device according to any one of (1) to (3), wherein a refractive index of the reflector structure is different from a refractive index of the color elements.

(5) The display device according to any one of (1) to (4), wherein the reflector structure includes a light-shielding film provided on the first edge face and the second edge face.

(6) The display device according to any one of (1) to (4), wherein the reflector structure includes a low refractive-index resin filled therein.

(7) The display device according to any one of (1) to (4), wherein the reflector structure includes a pigment filled therein.

(8) The display device according to any one of (1) to (7), wherein the inclination of the first edge face and the second edge face is in a reverse taper.

(9) The display device according to any one of (1) to (7), wherein the inclination of the first edge face and the second edge face is in a forward taper.

(10) The display device according to any one of (1) to (9), wherein
  the color elements further include color elements of a same color including respective edge faces having the inclination, and
  the reflector structure is provided in the gap formed by the inclination.

(11) The display device according to any one of (1) to (10), wherein
  the light emitting elements each include a first electrode, an organic layer that includes at least a light emitting layer, and a second electrode that are provided in order on the first electrode, and
  the color elements are disposed on a protective film provided on the light emitting elements.

(12) The display device according to any one of (1) to (11), further including:
  a second substrate that is disposed on the color elements and faces the first substrate; and
  a resin that provides sealing between the color elements and the second substrate.

(13) The display device according to any one of (1) to (12), further including a second substrate that is disposed on the color elements and faces the first substrate, wherein
  a hollow structure is provided between the color elements and the second substrate.

(14) An electronic apparatus provided with a display device, the display device including a first substrate that includes light emitting elements and color elements for respective pixels, the color elements being provided over the light emitting elements,
the color elements include:
  a color element of one color including a first edge face;
  a color element of another color including a second edge face, the second edge face being adjacent to the first edge face, and at least the first edge face and the second edge face each having inclination; and
  a reflector structure provided in a gap formed by the inclination.

This application claims the priority on the basis of Japanese Patent Application No. 2014-167195 filed on Aug. 20, 2014 in Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display device, comprising:
   a first substrate;
   a plurality of pixels;
   a plurality of light emitting elements of the plurality of pixels on the first substrate, wherein each light emitting element of the plurality of light emitting elements includes:
      a first electrode on the first substrate;
      an organic layer on the first electrode; and
      a second electrode on the organic layer;
   a protective film on the second electrode of each light emitting element of the plurality of light emitting elements;
   a plurality of color elements of the plurality of pixels on the protective film,
   wherein
      the plurality of color elements is in contact with the protective film, and
      the plurality of color elements includes:
         a first color element of a first color, wherein the first color element comprises a first inclined edge;
         a second color element of a second color, wherein the second color element comprises a second inclined edge,
         the second inclined edge of the second color element is adjacent to the first inclined edge of the first color element, and
         a gap is formed between the first inclined edge and the second inclined edge; and
   a reflector structure in the gap formed between the first inclined edge and the second inclined edge, wherein
      the reflector structure includes one of a light-reflecting film or a light-shielding film on each of the first inclined edge of the first color element, the second inclined edge of the second color element, and a bottom of the gap formed between the first inclined edge and the second inclined edge,
      the light-reflecting film or the light-shielding film is in contact with the first inclined edge and the second inclined edge, and
      the second electrode is in contact with the light-reflecting film or the light-shielding film at the bottom of the gap formed between the first inclined edge and the second inclined edge.

2. The display device according to claim 1, wherein the reflector structure has light absorbing property.

3. The display device according to claim 1, wherein the reflector structure has light reflecting property.

4. The display device according to claim 1, wherein a refractive index of the reflector structure is different from a refractive index of the plurality of color elements.

5. The display device according to claim 1, wherein the reflector structure includes a resin.

6. The display device according to claim 1, wherein the reflector structure includes a pigment.

7. The display device according to claim 1, wherein inclination of the first inclined edge and the second inclined edge is in a reverse taper.

8. The display device according to claim 1, wherein inclination of the first inclined edge and the second inclined edge is in a forward taper.

9. The display device according to claim 1, wherein the first color of the first color element is same as the second color of the second color element.

10. The display device according to claim 1, wherein the organic layer includes a light emitting layer.

11. The display device according to claim 1, further comprising:
   a second substrate on the plurality of color elements, wherein the second substrate faces the first substrate; and
   a resin that seals the plurality of color elements and the second substrate.

12. The display device according to claim 1, further comprising a second substrate on the plurality of color elements, wherein
   the second substrate faces the first substrate, and
   a hollow structure is between the plurality of color elements and the second substrate.

13. An electronic apparatus, comprising:
   a display device, wherein the display device comprises:
      a first substrate;
      a plurality of pixels;
      a plurality of light emitting elements of the plurality of pixels on the first substrate, wherein each light emitting element of the plurality of light emitting elements includes:
         a first electrode on the first substrate;
         an organic layer on the first electrode; and
         a second electrode on the organic layer;
      a protective film on the second electrode of each light emitting element of the plurality of light emitting elements;
      a plurality of color elements of the plurality of pixels on the protective film,
      wherein
         the plurality of color elements is in contact with the protective film, and
         the plurality of color elements includes:
            a first color element of a first color, wherein the first color element comprises a first inclined edge;
            a second color element of a second color, wherein the second color element comprises a second inclined edge,
            the second inclined edge of the second color element is adjacent to the first inclined edge of the first color element, and
            a gap is formed between the first inclined edge and the second inclined edge; and
      a reflector structure in the gap formed between the first inclined edge and the second inclined edge, wherein
         the reflector structure includes one of a light-reflecting film or a light-shielding film on each of the first inclined edge of the first color element, the second inclined edge of the second color element, and a bottom of the gap formed between the first inclined edge and the second inclined edge,
         the light-reflecting film or the light-shielding film is in contact with the first inclined edge and the second inclined edge, and
         the second electrode is in contact with the light-reflecting film or the light-shielding film at the bottom of the gap formed between the first inclined edge and the second inclined edge.

* * * * *